US008624238B2

(12) United States Patent
Kim et al.

(10) Patent No.: US 8,624,238 B2
(45) Date of Patent: Jan. 7, 2014

(54) THIN-FILM TRANSISTOR SUBSTRATE AND METHOD OF FABRICATING THE SAME

(75) Inventors: Jong-In Kim, Suwon-si (KR);
Young-Wook Lee, Suwon-si (KR);
Jean-Ho Song, Yongin-si (KR);
Jae-Hyoung Yoon, Hwaseong-si (KR);
Sung-Ryul Kim, Cheonan-si (KR);
Byeong-Beom Kim, Suwon-si (KR);
Je-Hyeong Park, Hwaseong-si (KR);
Woo-Geun Lee, Yongin-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 331 days.

(21) Appl. No.: 13/004,665

(22) Filed: Jan. 11, 2011

(65) Prior Publication Data
US 2011/0175088 A1 Jul. 21, 2011

(30) Foreign Application Priority Data
Jan. 18, 2010 (KR) .................. 10-2010-0004486

(51) Int. Cl.
*H01L 21/34* (2006.01)
*H01L 29/786* (2006.01)

(52) U.S. Cl.
USPC .......... 257/43; 257/57; 257/59; 257/E29.296; 257/E29.299; 257/E21.46; 438/104; 438/158

(58) Field of Classification Search
USPC ......... 257/43, 59, E21.411, E21.46, E29.296, 257/E29.299; 438/104, 158
See application file for complete search history.

(56) References Cited

U.S. PATENT DOCUMENTS

| | | | |
|---|---|---|---|
| 2003/0127649 A1* | 7/2003 | Chae | 257/72 |
| 2008/0258141 A1* | 10/2008 | Park et al. | 257/43 |
| 2009/0020758 A1* | 1/2009 | Lee et al. | 257/59 |
| 2010/0289977 A1* | 11/2010 | Liu | 349/44 |

* cited by examiner

*Primary Examiner* — Julio J Maldonado
*Assistant Examiner* — Daniel Shook
(74) *Attorney, Agent, or Firm* — F. Chau & Associates, LLC

(57) ABSTRACT

A thin-film transistor (TFT) substrate having reduced defects is fabricated using a reduced number of masks. The TFT substrate includes gate wiring formed on a substrate. The gate wiring includes a gate electrode. A semiconductor pattern is formed on the gate wiring. An etch-stop pattern is formed on the semiconductor pattern. Data wiring includes a source electrode which is formed on the semiconductor pattern and the etch-stop pattern. Each of the gate wiring and the data wiring includes a copper-containing layer and a buffer layer formed on or under the copper-containing layer.

27 Claims, 16 Drawing Sheets

THIN-FILM TRANSISTOR SUBSTRATE AND METHOD OF FABRICATING THE SAME

CROSS-REFERENCE TO RELATED APPLICATIONS

This application claims priority from Korean Patent Application No. 10-2010-0004486 filed on Jan. 18, 2010 in the Korean Intellectual Property Office, the disclosure of which is incorporated herein by reference in its entirety.

BACKGROUND OF THE INVENTION

1. Technical Field

The present invention relates to a thin-film transistor (TFT), and more particularly, to a TFT substrate and a method of fabricating the TFT substrate.

2. Discussion of the Related Art

Liquid crystal displays (LCDs) are one of the most widely used types of flat panel displays. Generally, an LCD includes two substrates having electrodes and a liquid crystal layer interposed between the substrates. In an LCD, voltages are applied to electrodes to rearrange liquid crystal molecules of a liquid crystal layer, thereby controlling the amount of light that passes through the liquid crystal layer. As a result, a desired image is displayed on the LCD.

An LCD uses a thin-film transistor (TFT) substrate that includes a TFT for switching each pixel. A TFT substrate includes gate wiring which delivers a gate signal and data wiring which delivers a data signal. Copper, a metal having a low resistance, may be used for forming gate wiring and data wiring.

When gate wiring and data wiring are formed using copper, a semiconductor pattern may become contaminated during an etching process for forming the data wiring. In addition, contact characteristics between the data wiring and the semiconductor pattern may deteriorate. Accordingly, a separate layer may be formed to prevent contamination of the semiconductor pattern and to enhance contact characteristics of the semiconductor pattern. However, formation of the separate layer may require an additional mask process.

SUMMARY OF THE INVENTION

Aspects of the present invention provide a thin-film transistor (TFT) substrate having reduced defects and fabricated using a reduced number of masks.

Aspects of the present invention provide a method of fabricating a TFT substrate having reduced defects by using a reduced number of masks.

However, aspects of the present invention are not restricted to the one set forth herein. The above and other aspects of the present invention will become more apparent to one of ordinary skill in the art to which the present disclosure pertains by referencing the detailed description given below.

According to an aspect of the present invention, there is provided a TFT substrate including gate wiring formed on a substrate and including a gate electrode, a semiconductor pattern formed on the gate wiring, an etch-stop pattern formed on the semiconductor pattern, and data wiring including a source electrode which is formed on the semiconductor pattern and the etch-stop pattern. Each of the gate wiring and the data wiring includes a copper-containing layer and a buffer layer formed on or under the copper-containing layer.

According to an aspect of the present invention, there is provided a TFT substrate including gate wiring formed on a substrate and including a gate electrode, a semiconductor pattern formed on the gate wiring, an etch-stop pattern formed on the semiconductor pattern, a pixel electrode formed on the semiconductor pattern and the etch-stop pattern, and data wiring including a source electrode which is formed on the pixel electrode. Each of the gate wiring and the data wiring includes a copper-containing layer.

According to an aspect of the present invention, there is provided a method of fabricating a TFT substrate. The method includes forming gate wiring, which contains copper, on a substrate, sequentially forming a semiconductor layer and an etch-stop film on the gate wiring, forming a first photoresist pattern, which includes two regions of different thicknesses, on the etch-stop film, and forming a semiconductor pattern and an etch-stop pattern by etching the semiconductor layer and the etch-stop film using the first photoresist pattern.

According to an aspect of the present invention, there is provided a method of fabricating a TFT substrate. The method includes forming gate wiring, which contains copper, on a substrate, sequentially forming a semiconductor pattern and an etch-stop pattern on the gate wiring, sequentially forming a transparent conductive film and a data wiring conductive film, which contains copper, on the semiconductor pattern and the etch-stop pattern, forming a photoresist pattern, which includes two regions of different thicknesses, on the data wiring conductive film, and forming a pixel electrode and a contact layer by etching the transparent conductive film using the photoresist pattern and forming data wiring by etching the data wiring conductive film using the photoresist pattern. The pixel electrode and the contact layer are made of the transparent conductive film and the data wiring includes a source electrode made of the data wiring conductive film.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EXEMPLARY EMBODIMENTS

Exemplary embodiments of the present invention may be understood more readily by reference to the following detailed description and the accompanying drawings. The present invention may, however, be embodied in many different forms and should not be construed as being limited to the embodiments set forth herein. Like numbers may refer to like elements throughout.

Figure 1:
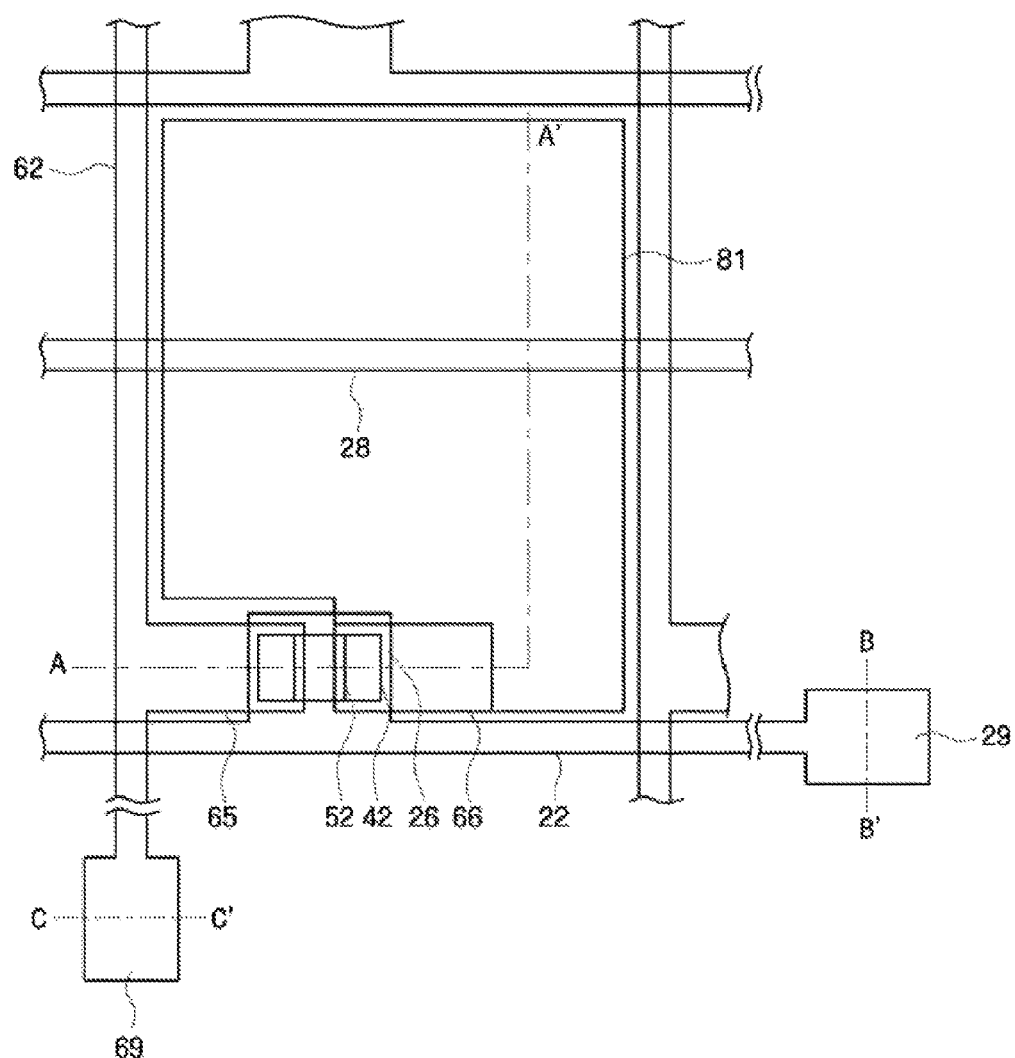
FIG. 1 is a layout view of a thin-film transistor (TFT) substrate according to an exemplary embodiment of the present invention.
Figure 2:
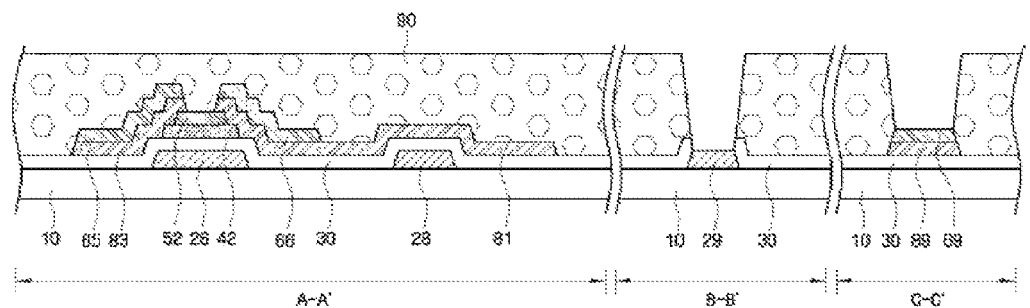
FIG. 2 is a cross-sectional view of the TFT substrate illustrated in FIG. 1 taken along the lines A-A', B-B', and C-C'.

Hereinafter, a thin-film transistor (TFT) substrate according to an exemplary embodiment of the present invention will be described in detail with reference to FIGS. 1 and 2. FIG. 1 is a layout view of a TFT substrate according to an exemplary embodiment of the present invention. FIG. 2 is a cross-sectional view of the TFT substrate of FIG. 1 taken along the lines A-A', B-B', and C-C'.

Referring to FIGS. 1 and 2, gate wiring, which delivers a gate signal, is formed on a substrate 10. The gate wiring includes a gate line 22 and a gate electrode 26. The gate line 22 extends horizontally, and the gate electrode 26 of a thin-film transistor is connected to the gate line 22 and protrudes from the gate line 22. A gate pad 29 may be formed at an end of the gate wiring 22 and 26 by increasing a width of an end of the gate line 22.

Storage wiring 28, which applies a storage voltage, is also formed on the substrate 10. The storage wiring 28 extends across a pixel region to be substantially parallel to the gate line 22. The storage wiring 28 is overlapped by a pixel electrode 81, which will be described later, to form a storage capacitor that increases the charge storage capability of a pixel. The shape and disposition of the storage wiring 28 may vary. If sufficient storage capacitance can be generated by overlapping the pixel electrodes 81 and the gate wiring 22 and 26, the storage wiring 28 may be omitted.

The gate wiring (including the gate line 22 and the gate electrode 26) and the storage wiring 28 contain copper. For example, each of the gate wiring 22 and 26 and the storage wiring 28 includes a layer made of copper-based metal such as copper or a copper alloy. Since copper is a metal with low resistivity, it can reduce a signal delay or a voltage drop of the gate wiring 22 and 26 and the storage wiring 28.

A gate insulating film 30 is formed on the substrate 10, the gate wiring 22 and 26, and the storage wiring 28. The gate insulating film 30 is formed on the entire surface of the substrate 10, excluding a top surface of the gate pad 29. The gate insulating film 30 may be made of silicon oxide (SiOx), silicon nitride (SiNx), or silicon oxynitride (SiON).

A semiconductor pattern 42 is formed on the gate insulating film 30. The semiconductor pattern 42 may be made of hydrogenated amorphous silicon or polycrystalline silicon. The semiconductor pattern 42 may include a film made of n+ hydrogenated amorphous silicon doped with n-type impurities in high concentration on a film made of hydrogenated amorphous silicon or polycrystalline silicon.

In addition, the semiconductor pattern 42 may be an oxide semiconductor pattern. The oxide semiconductor pattern may contain any one of InZnO, InGaO, InSnO, ZnSnO, GaSnO, GaZnO, GaZnSnO, GaInZnO, HfInZnO, and ZnO. This oxide semiconductor has 2 to 100 times greater effective charge mobility than hydrogenated amorphous silicon, thereby showing excellent semiconductor properties.

An etch-stop pattern 52 is formed on the semiconductor pattern 42. The etch-stop pattern 52 prevents introduction of copper into the semiconductor pattern 42 during a subsequent etching or deposition process performed to form a source electrode 65 and a drain electrode 66. Furthermore, the etch-stop pattern 52 prevents the semiconductor pattern 42 from being damaged by an etchant or an etch gas. The etch-stop pattern 52 is formed to cover a channel region of the semiconductor pattern 42. For example, to prevent exposure of the channel region of the semiconductor pattern 42, the etch-stop pattern 52 may be formed in a region overlapping the channel region and may be wider than the channel region. The etch-stop pattern 52 may be made of any one of SiOx, SiNx, and SiON.

The pixel electrode 81 and a contact layer 83 are formed on the gate insulating film 30, the semiconductor pattern 42, and the etch-stop pattern 52. The contact layer 83 is made of the same material as the pixel electrode 81. An auxiliary data pad 89 made of the same material as the pixel electrode 81 may be formed in a data pad region. The pixel electrode 81, the contact layer 83, and the auxiliary data pad 89 are formed of a transparent conductive film containing indium tin oxide (ITO) or indium zinc oxide (IZO).

According to exemplary embodiments of the present invention, the contact layer 83 is completely overlapped by the source electrode 65 which will be described later, and the pixel electrode 81 is completely overlapped by the drain electrode 66, which will be described later. The contact layer 83 extends a predetermined distance beyond the drain electrode 66. Therefore, the source electrode 65 and the drain electrode 66 directly contact the contact layer 83 and the pixel electrode 81 but do not contact the semiconductor pattern 42. When the source electrode 65 and the drain electrode 66 contain copper, if the semiconductor pattern 42 is an oxide semiconductor pattern, the contact resistance between the semiconductor pattern 42 and the source and drain electrodes 65 and 66 may be high. However, according to exemplary embodiments of the present invention, since the pixel electrode 81 made of a transparent conductive film and the contact layer 83 made of the same material as the pixel electrode 81 are formed to directly contact the semiconductor pattern 42, the contact resistance between the source and drain electrodes 65 and 66 and the semiconductor pattern 42 can be reduced.

Data wiring is formed on the pixel electrode 81 and the contact layer 83. The data wiring includes a data line 62, the source electrode 65, and the drain electrode 66. The data line 62 extends vertically to cross the gate line 22 and thus define a pixel. The source electrode 65 branches off from the data line 62 and extends onto the semiconductor pattern 42. The drain electrode 66 is separated from the source electrode 65 and extends onto the semiconductor pattern 42 to face the source electrode 65 with respect to the gate electrode 26 or the channel region of the thin-film transistor. A data pad 69 may be formed at an end of the data wiring 62, 65, and 66 by increasing a width of an end of the data line 62. The data pad 69 may be formed on the auxiliary data pad 89 which is made of the same material as the pixel electrode 81.

The data wiring 62, 65, and 66 contains copper. For example, the data wiring 62, 65, and 66 includes a layer made of copper-based metal such as copper or a copper alloy. Since copper is metal with low resistivity, it can reduce a signal delay or a voltage drop of the data wiring 62, 65, and 66.

A protective film 90 is formed on the data wiring 62, 65, and 66 and the pixel electrode 81. The protective film 90 is formed on the entire surface of the substrate 10 excluding top surfaces of the gate pad 29 and the data pad 69. The protective film 90 protects the data wiring 62, 65, and 66 and the pixel electrode 81 and planarizes a step difference of an underlying structure. The protective film 90 may be a photosensitive organic or inorganic film.

Figure 3:
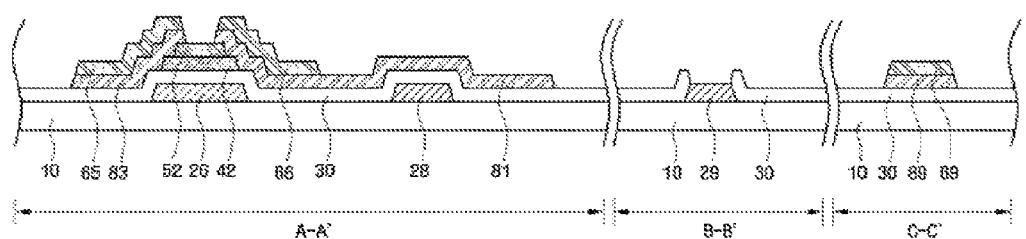
FIG. 3 is a cross-sectional view of a modified example of the TFT substrate illustrated in FIG. 1.

A modified example of the TFT substrate illustrated in FIG. 1 will now be described with reference to FIG. 3. FIG. 3 is a cross-sectional view of a modified example of the TFT substrate according to an exemplary embodiment of the present invention.

Referring to FIG. 3, a protective film 90 may be omitted.

Hereinafter, a method of fabricating a TFT substrate, for example, a TFT substrate similar or identical to those described above with respect to FIGS. 1 and 2 according to an exemplary embodiment of the present invention will be described in detail with reference to FIGS. 1 through 13. FIGS. 4 through 13 are cross-sectional views sequentially illustrating processes included in a method of fabricating the TFT substrate according to an exemplary embodiment of the present invention.

Figure 4:
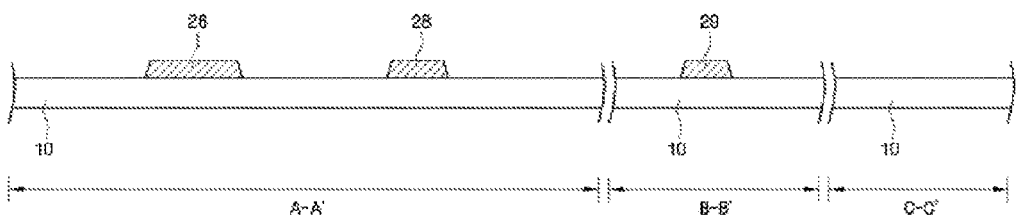
FIGS. 4 through 13 are cross-sectional views sequentially illustrating processes included in a method of fabricating the TFT illustrated in FIG. 1 according to an exemplary embodiment of the present invention.

First, referring to FIGS. 1 and 4, the gate wiring 22 and 26 including the gate electrode 26 is formed on the substrate 10. The forming of the gate wiring 22 and 26 includes forming the storage wiring 28 and the gate pad 29.

Specifically, a gate wiring conductive film is formed on the substrate 10. The gate wiring conductive film contains copper. The gate wiring conductive film may be formed by sputtering. If the substrate 10 is made of soda lime glass which is weak when exposed to heat, low-temperature sputtering may be employed.

Next, the gate wiring conductive film is patterned by wet etching or dry etching to form the gate wiring (including the gate line 22 and the gate electrode 26), the storage wiring 28, and the gate pad 29. For wet etching, phosphoric acid, nitric acid, or acetic acid may be used as an etchant. For dry etching, a chorine (Cl)-based etch gas, such as $Cl_2$ or $BCl_3$, may be used.

Figure 5:
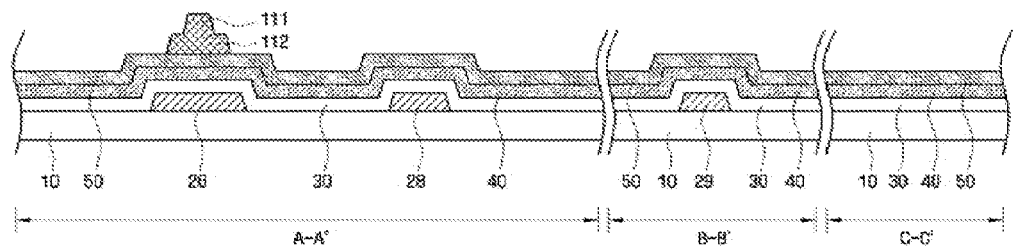

Next, referring to FIGS. 1 and 5, the gate insulating film 30, a semiconductor layer 40, and an etch-stop film 50 are sequentially formed on the gate wiring 22 and 26, the storage wiring 28, and the gate pad 29. The gate insulating film 30, the semiconductor layer 40, and the etch-stop film 50 may be formed on the entire surface of the substrate 10 by chemical vapor deposition (CVD) or sputtering.

Then, a photoresist layer is coated on the etch-stop film 50 and patterned to form a first photoresist pattern 111 and 112 which is used to form the semiconductor pattern 42 and the etch-stop pattern 52. The first photoresist pattern 111 and 112 includes two regions of different thicknesses. A thick region 111 covers a region in which the etch-stop pattern 52 is to be formed, and a thin region 112 covers a region in which the semiconductor pattern 42 is to be formed. The first photoresist pattern 111 and 112 may be formed using a slit mask or a halftone mask.

Figure 6:
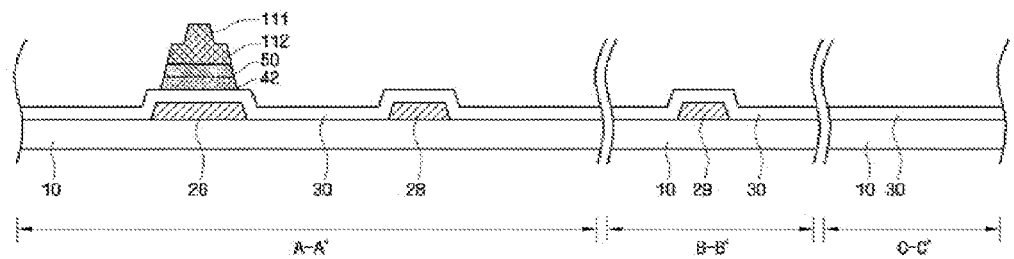

Next, referring to FIGS. 5 and 6, the etch-stop film 50 and the semiconductor layer 40 are etched using the first photoresist pattern 111 and 112 as an etch mask. As a result of etching the semiconductor layer 40, the semiconductor pattern 42 is formed. The etch-stop film 50 and the semiconductor layer 40 may be wet- or dry-etched separately or may be etched simultaneously.

Figure 7:
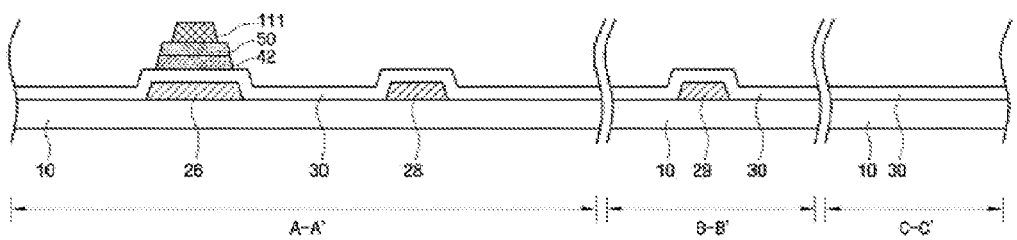

Next, referring to FIG. 7, the first photoresist pattern 111 and 112 is etched back, thereby leaving the thick region 111 while removing the thin region 112. The removal of the thin region 112 may be accomplished by an ashing process using oxygen.

Figure 8:
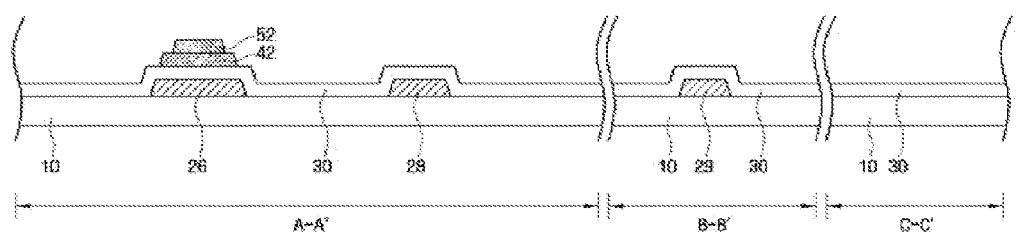

Then, referring to FIGS. 7 and 8, the etch-stop film 50 is etched using the remaining thick region 111 of the first photoresist pattern as an etch mask. As a result of etching the etch-stop film 50, the etch-stop pattern 52 is formed. The etch-stop film 50 may be dry-etched using an etch gas such as $CF_3$, $CHF_6$, or $Cl_2$. Since the etch-stop pattern 52 and the semiconductor pattern 42 are formed using one first photoresist pattern 111 and 112, no additional mask is required to form the etch-stop pattern 52.

Next, the remaining thick region 111 of the first photoresist pattern is removed.

Figure 9:
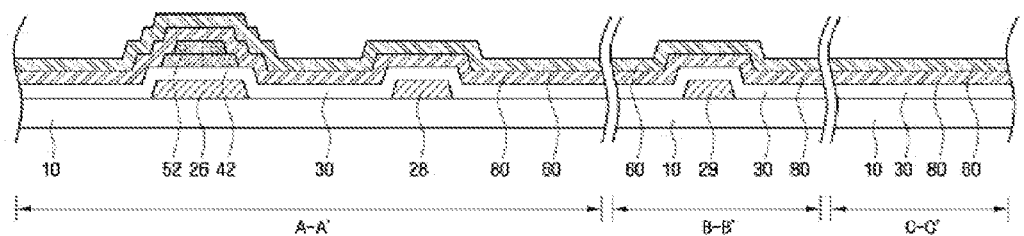

Then, referring to FIG. 9, a transparent conductive film 80 and a data wiring conductive film 60, which contains copper, are sequentially formed on the semiconductor pattern 42 and the etch-stop pattern 52. The transparent conductive film 80 and the data wiring conductive film 60 may be formed by sputtering.

Figure 10:
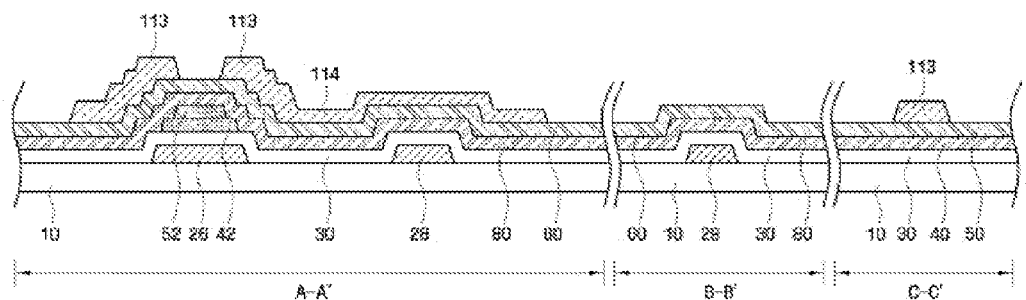

Next, referring to FIGS. 1, 2, and 10, a photoresist layer is coated on the data wiring conductive film 60 and patterned to form a second photoresist pattern 113 and 114 which is used to form the pixel electrode 81, the contact layer 83, the auxiliary data pad 89, the data wiring (including the data line 62, the source electrode 65 and the drain electrode 66), and the data pad 69. The second photoresist pattern 113 and 114 includes two regions of different thicknesses. A thin region 114 covers a region in which the pixel electrode 81 is to be formed, and a thick region 113 covers a region in which the contact layer 83, the auxiliary data pad 89, the data wiring 62, 65, and 66, and the data pad 69 may be formed. The second photoresist pattern 113 and 114 may be formed using a slit mask or a halftone mask.

Figure 11:
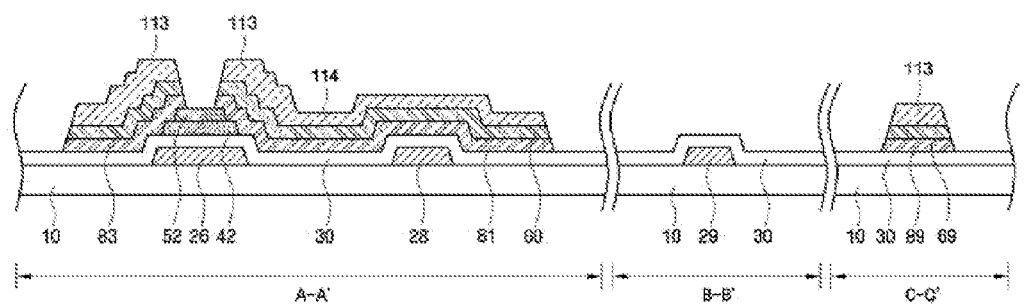

Next, referring to FIGS. 10 and 11, the data wiring conductive film 60 and the transparent conductive film 80 are etched using the second photoresist pattern 113 and 114 as an etch mask. As a result of etching the transparent conductive film 80, the pixel electrode 81, the contact layer 83, and the auxiliary data pad 89 are formed. The data wiring conductive film 60 in the data pad region is etched to form the data pad 69. The transparent conductive film 80 and the data wiring conductive film 60 may be wet- or dry-etched separately or may be wet-etched simultaneously using an etchant that contains nitric acid and fluorine ions.

Figure 12:
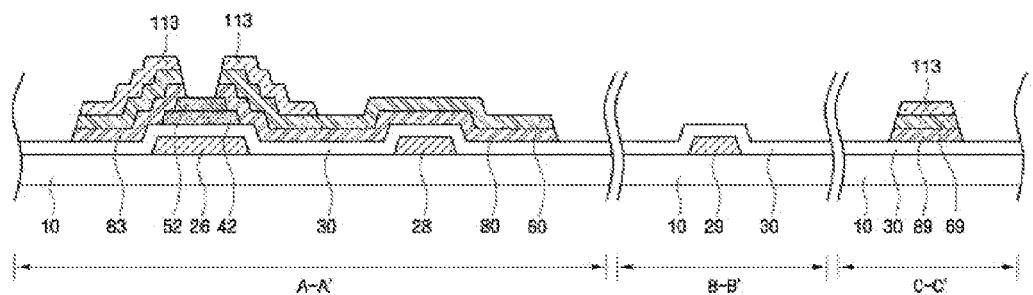

Next, referring to FIGS. 11 and 12, the second photoresist pattern 113 and 114 is etched back, thereby leaving the thick region 113 while removing the thin region 114. The removal of the thin region 114 may be accomplished by an ashing process using oxygen.

Figure 13:
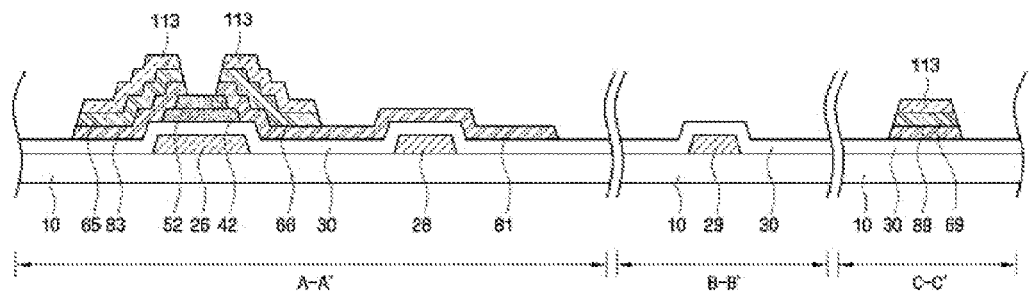

Then, referring to FIGS. 12 and 13, the data wiring conductive film 60 is etched using the remaining thick region 113 of the second photoresist pattern as an etch mask. As a result of etching the data wiring conductive film 60, the data wiring (including the data line 62, the source electrode 65, and the drain electrode 66) is formed. The data wiring conductive film 60 may be wet-etched or dry-etched. In the case of wet etching, an etchant having a sufficiently high etch selectivity with respect to the semiconductor pattern 42 under the data wiring conductive film 60 is used. In the case of dry etching, an ashing process for removing the thin region 114 of the second photoresist pattern and the etching process can be performed successively.

As described above, the transparent conductive film 80 is formed before the data conductive film 60, and the transparent conductive film 80 and the data wiring conductive film 60 are etched using the second photoresist pattern 113 and 114. Accordingly, the number of masks used is minimized. In addition, since the contact layer 83 and the pixel electrode 81 which contact the semiconductor pattern 42 are formed by patterning the transparent conductive film 80 under the data wiring conductive film 60, contact characteristics between the semiconductor pattern 42 and the source and drain electrodes 65 and 66 can be improved, especially when the semiconductor pattern 42 is an oxide semiconductor pattern. Moreover, since a thick organic film is not formed between the pixel electrode 81 and the storage wiring 28, the process of ashing the organic film may be omitted.

Next, referring to FIGS. 13 and 2, the remaining thick region 113 of the second photoresist pattern is removed. Then, the protective film 90 is formed on the source electrode 65, the drain electrode 66, and the pixel electrode 81.

The protective film 90 is formed to expose the top surfaces of the gate pad 29 and the data pad 69. For example, if the protective film 90 is a positive photosensitive organic film, regions of the protective film 90 which correspond respectively to the gate pad 29 and the data pad 69 may be exposed to light and then developed to expose the top surfaces of the gate pad 29 and the data pad 69. If the protective film 90 is a negative photosensitive organic film, regions other than the regions, which correspond respectively to the gate pad 29 and the data pad 69, may be exposed to light and then developed to expose the top surfaces of the gate pad 29 and the data pad 69. Meanwhile, if the protective film 90 is an inorganic film, the inorganic film formed on the top surfaces of the gate pad 29 and the data pad 69 is removed using a conventional photolithography process for forming a photoresist pattern.

To fabricate the TFT substrate shown in FIG. 3, the process of removing the protective film 90 may further be performed.

In FIGS. 4 through 13, the semiconductor pattern 42 and the etch-stop pattern 52 are formed using the first photoresist pattern (consisting of the thick and thin regions 111 and 112), and the pixel electrode 81 and the data wiring 62, 65, and 66 are formed using the second photoresist pattern (consisting of the thick and thin regions 113 and 114). However, the present invention is not limited thereto. For example, after the semiconductor pattern 42 and the etch-stop pattern 52 are formed using the first photoresist pattern 111 and 112, the pixel electrode 81 may be formed by a photolithography process using a pixel electrode mask, and the data wring 62, 65, and 66 may be formed by another photolithography process using a data wiring mask. Alternatively, the semiconductor pattern 42 and the etch-stop pattern 52 may respectively be formed by photolithography processes using a semiconductor pattern mask and an etch-stop pattern mask, and the pixel electrode 81 and the data wiring 62, 65, and 66 may be formed using the second photoresist pattern 113 and 114.

Figure 14:
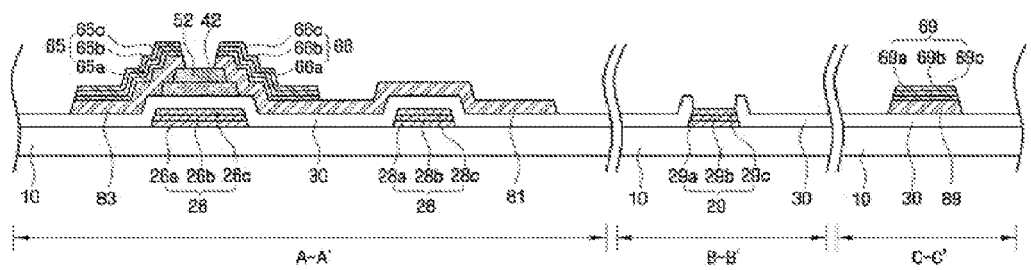
FIG. 14 is a cross-sectional view of a TFT substrate according to an exemplary embodiment of the present invention.

Hereinafter, a TFT substrate according to an exemplary embodiment of the present invention will be described with reference to FIGS. 1 and 14. FIG. 14 is a cross-sectional view of a TFT substrate according to an exemplary embodiment of the present invention. Elements substantially identical to those discussed above may be indicated by like reference numerals, and thus their description may be omitted.

Referring to FIGS. 1 and 14, the TFT substrate according to an exemplary embodiment includes gate wiring 22 and 26, storage wiring 28, and a gate pad 29 which are formed as triple layers. A gate electrode 26, the storage wiring 28, and the gate pad 29 respectively include copper-containing layers 26b, 28b and 29b, buffer layers 26a, 28a and 29a formed under the copper-containing layers 26b, 28b and 29b, and buffer layers 26c, 28c and 29c formed on the copper-containing layers 26b, 28b and 29b. The buffer layers 26a, 26c, 28a, 28c, 29a and 29c may increase adhesion of the copper-containing layers 26b, 28b and 29b to another layer or protect the copper-containing layers 26b, 28b and 29b. The buffer layers 26a, 26c, 28a, 28c, 29a and 29c may contain any one of Mo, Ti, W, an alloy of the above metals, an oxide of the above metals, a nitride of the above metals, SiOx, SiNx, and SiON.

Data wiring (including a data line 62, a source electrode 65 and a drain electrode 66) and a data pad 69 may also be formed as triple layers. For example, the source electrode 65, the drain electrode 66, and the data pad 69 respectively include copper-containing layers 65b, 66b and 69b, buffer layers 65a, 66a and 69a formed under the copper-containing layers 65b, 66b and 69b, and buffer layers 65c, 66c and 69c formed on the copper-containing layers 65b, 66b and 69b.

In FIG. 14, buffer layers are formed both on and under a copper-containing layer. However, the present invention is not limited thereto. For example, a buffer layer may be formed only on a copper-containing layer or only under the copper-containing layer. In FIG. 14, a protective film (indicated by reference numeral 90 in FIG. 2) is removed. However, the present invention is not limited thereto. The protective film (indicated by reference numeral 90 in FIG. 2) may remain.

Figure 15:
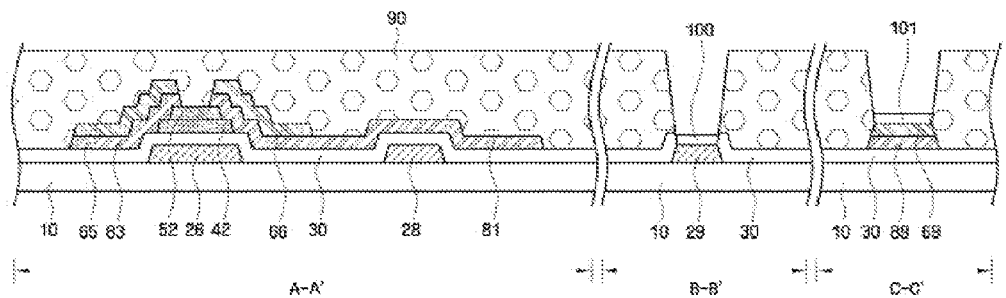
FIG. 15 is a cross-sectional view of a TFT substrate according to an exemplary embodiment of the present invention.

Hereinafter, a TFT substrate according to an exemplary embodiment of the present invention will be described with reference to FIG. 15. FIG. 15 is a cross-sectional view of a TFT substrate according to an exemplary embodiment of the present invention. Elements substantially identical to those discussed above may be indicated by like reference numerals, and thus their description may be omitted. Referring to FIG. 15, capping layers 100 and 101 are selectively and respectively formed on top surfaces of a gate pad 29 and a data pad 69 which are exposed by a protective film 90. The capping layers 100 and 101 are formed to protect the exposed top surfaces of the gate pad 29 and the data pad 69 which contain copper. The capping layers 100 and 101 may be made of a transparent conductive film. To selectively form the capping layers 100 and 101 only on the top surfaces of the gate pad 29 and the data pad 69, the protective film 90 may be formed of a photosensitive organic film that contains a $CH_3$ group and has hydrophobic properties, and a transparent conductive film may be deposited by metal organic chemical vapor deposition (MOCVD). Then, the transparent conductive film may selectively be formed only on the exposed top surfaces of the gate pad 29 and the data pad 69 on which the protective film 90 is not formed. Accordingly, the capping layers 100 and 101 are formed.

Figure 16:
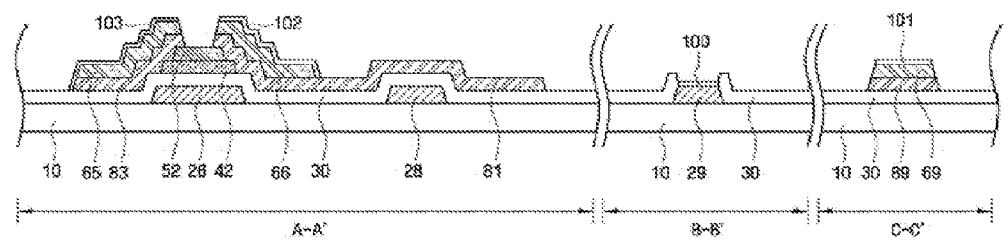
FIG. 16 is a cross-sectional view of a TFT substrate according to an exemplary embodiment of the present invention.

Hereinafter, a TFT substrate according to an exemplary embodiment of the present invention will be described with reference to FIG. 16. FIG. 16 is a cross-sectional view of a TFT substrate according to an exemplary embodiment of the present invention. Elements substantially identical to those discussed above may be indicated by like reference numerals, and thus their description may be omitted.

Referring to FIG. 16, capping layers 100 through 103 are respectively formed on top surfaces of a gate pad 29, a data pad 69, a source electrode 65, and a drain electrode 66. As described above, the capping layers 100 through 103 may be formed of a transparent conductive film.

Figure 17:
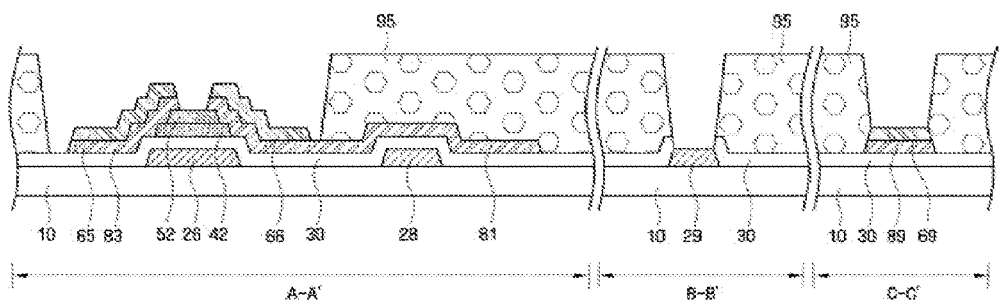
FIG. 17 is a cross-sectional view illustrating some processes included in a method of fabricating the TFT substrate illustrated in FIG. 16 according to an exemplary embodiment of the present invention.

Hereinafter, a method of fabricating the TFT substrate according to an exemplary embodiment of the present invention will be described with reference to FIGS. 2, 3, and 17. FIG. 17 is a cross-sectional view illustrating some processes included in a method of fabricating the TFT substrate according an exemplary embodiment of the present invention. Elements substantially identical to those described above may be indicated by like reference numerals, and thus their description may be omitted. Referring to FIG. 17, the top surfaces of the gate pad 29 and the data pad 69 are exposed using a protective film 90 as described above with reference to FIG. 2. Then, the protective film 90 is removed as shown in FIG. 3.

Next, referring to FIG. 17, a cover film 95 is formed to expose the top surfaces of the gate pad 29, the data pad 69, the source electrode 65, and the drain electrode 66. As described above, the cover film 95 may be formed of a photosensitive organic film that contains a $CH_3$ group and has hydrophobic properties.

Next, a transparent conductive film is deposited by MOCVD. Then, the transparent conductive film may selectively be formed on the top surfaces of the gate pad 29, the data pad 69, the source electrode 65, and the drain electrode 66 on which the cover film 95 is not formed. Accordingly, the capping layers 100 through 103 are formed.

Figure 18:
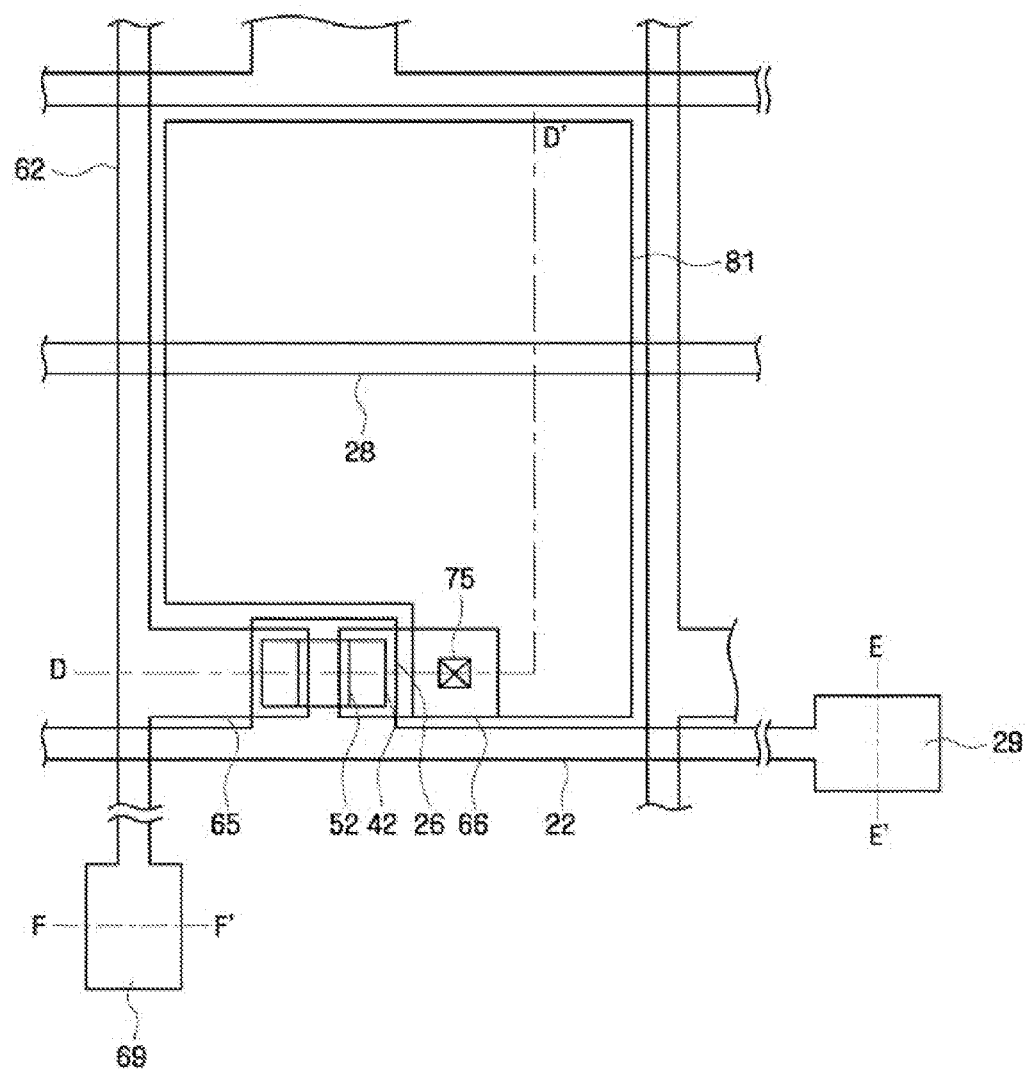
FIG. 18 is a layout view of a TFT substrate according to an exemplary embodiment of the present invention.
Figure 19:
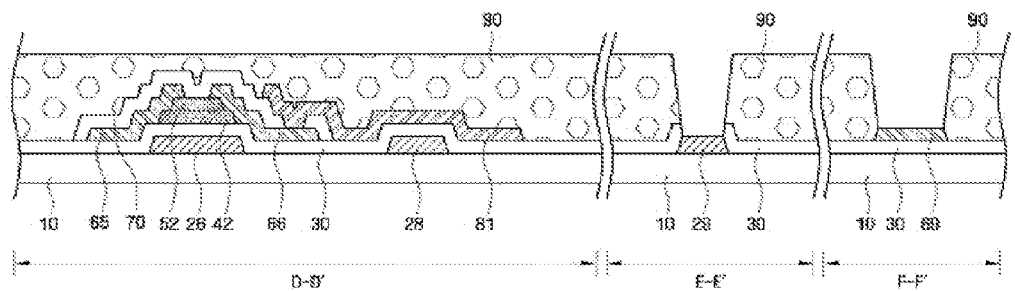
FIG. 19 is a cross-sectional view of the TFT substrate illustrated in FIG. 18 taken along the lines D-D', E-E', and F-F'.

Hereinafter, a TFT substrate according to an exemplary embodiment of the present invention will be described in detail with reference to FIGS. 18 and 19. FIG. 18 is a layout view of a TFT substrate according to an exemplary embodiment of the present invention. FIG. 19 is a cross-sectional view of the TFT substrate of FIG. 18 taken along the lines D-D', E-E', and F-F'. Elements substantially identical to those above may be indicated by like reference numerals, and thus their description may be omitted.

Referring to FIGS. 18 and 19, a drain electrode 66 is formed under a pixel electrode 81 in the TFT substrate. In addition, a passivation film 70 is formed between the drain electrode 66 and the pixel electrode 81. The drain electrode 66 and the pixel electrode 81 contact each other by a contact hole 75 formed in the passivation film 70.

Figure 20:
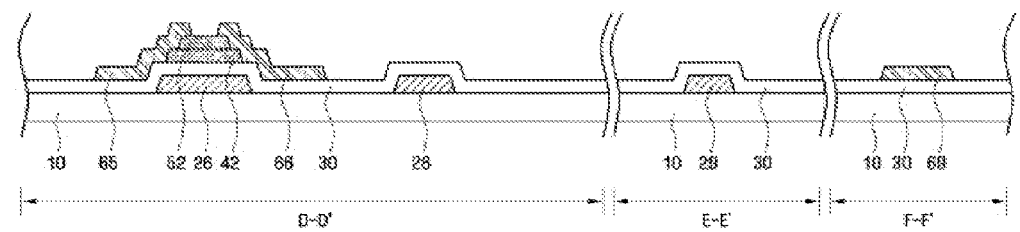
FIGS. 20, 21 and 22 are cross-sectional views sequentially illustrating some processes included in a method of fabricating the TFT substrate according to an exemplary embodiment of the present invention.

Hereinafter, a method of fabricating the TFT substrate according to an exemplary embodiment of the present invention will be described with reference to FIGS. 4 through 8 and 18 through 22. FIGS. 20 and 22 are cross-sectional views sequentially illustrating some processes included in a method of fabricating the TFT substrate according to an exemplary embodiment of the present invention. Elements substantially identical to those described above may be indicated by like reference numerals, and thus their description may be omitted. First, gate wiring (including a gate line 22 and a gate electrode 26), storage wiring 28, a gate pad 29, a gate insulating film 30, a semiconductor pattern 42, and an etch-stop pattern 52 are formed on a substrate 10 using the processes illustrated in FIGS. 4 through 8.

Then, referring to FIGS. 18 and 20, a data wiring conductive film which contains copper is formed on the etch-stop pattern 52 and etched to form the copper-containing data wiring (including a data line 62, a source electrode 65 and the drain electrode 66) and a data pad 69.

Figure 21:
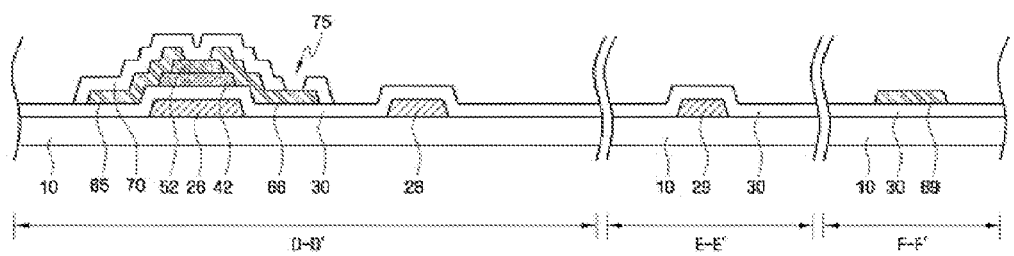
Figure 22:
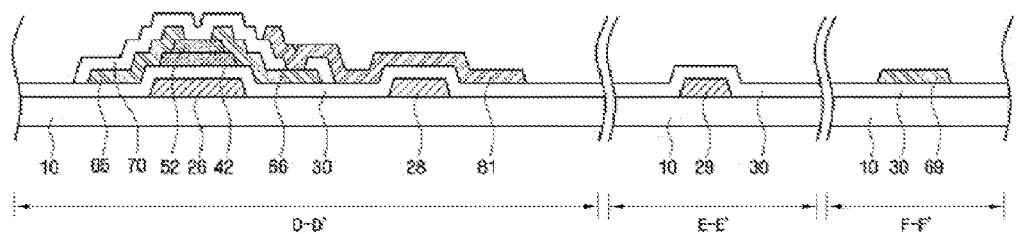

Next, referring to FIG. 21, the passivation film 70 is formed on the source electrode 65 and the drain electrode 66, and the contact hole 75 is formed in the passivation film 70 to expose a predetermined region of the drain electrode 66. Unlike the illustration of FIG. 21, the passivation film 70 may be formed on the entire surface of the substrate 10 excluding the contact hole 75.

Then, referring to FIG. 22, a pixel electrode conductive film is formed on the passivation film 70 and etched to form the pixel electrode 81.

Next, referring to FIG. 19, a protective film 90 is formed on the pixel electrode 81. The protective film 90 is formed to expose top surfaces of the gate pad 29 and the data pad 69.

Figure 23:
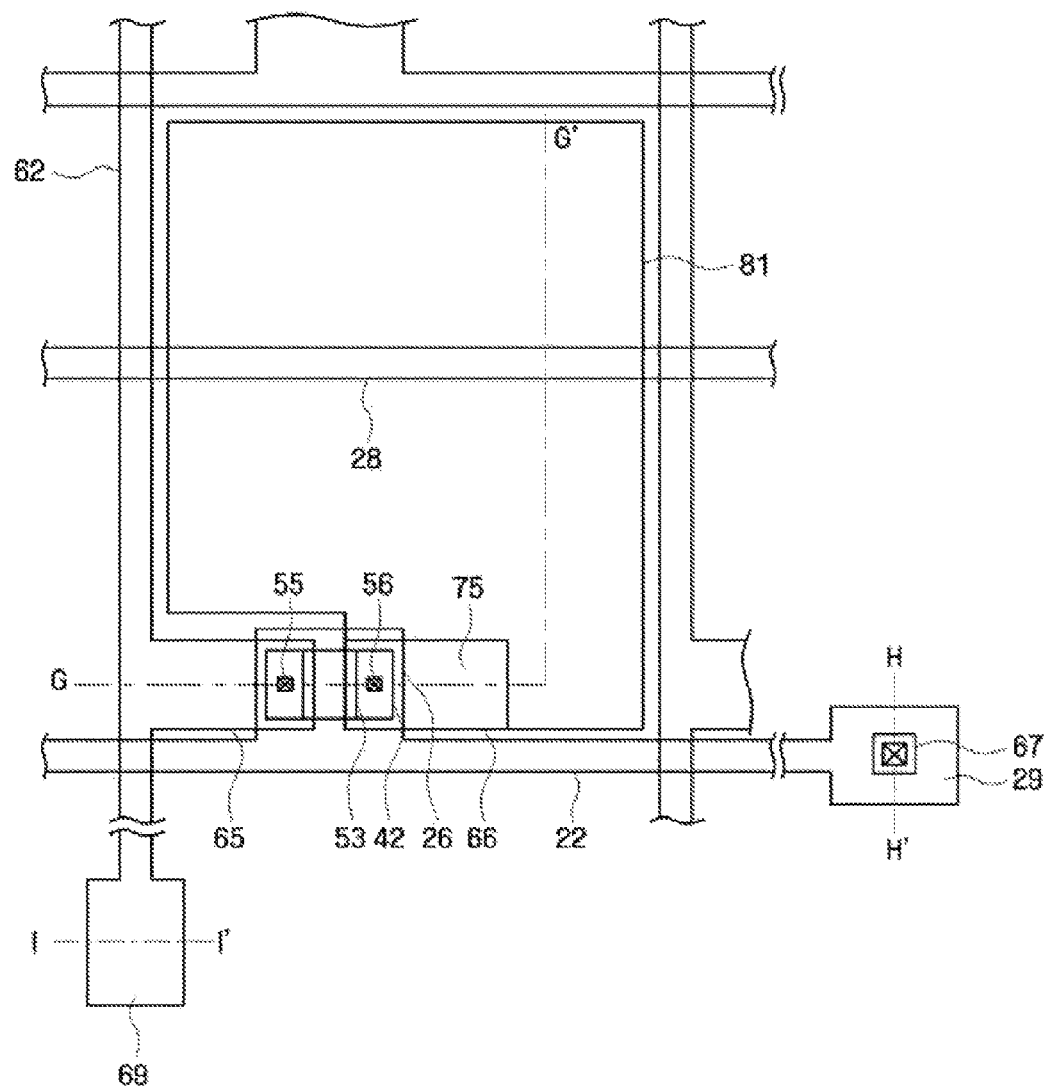
FIG. 23 is a layout view of a TFT substrate according to an exemplary embodiment of the present invention.
Figure 24:
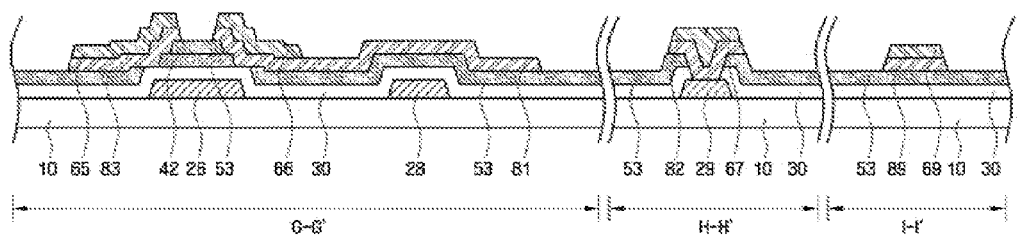
FIG. 24 is a cross-sectional view of the TFT substrate illustrated in FIG. 23 taken along the lines G-G', H-H', and I-I'.

Hereinafter, a TFT substrate according to an exemplary embodiment of the present invention will be described in detail with reference to FIGS. 23 and 24. FIG. 23 is a layout view of a TFT substrate according to an exemplary embodiment of the present invention. FIG. 24 is a cross-sectional view of the TFT substrate of FIG. 23 taken along the lines G-G', H-H', and I-I'. Elements substantially identical to those discussed above may be indicated by like reference numerals, and thus their description may be omitted.

Referring to FIGS. 23 and 24, an etch-stop pattern 53 is formed on the entire surface of a substrate 10 to expose a predetermined region of a semiconductor pattern 42 and a predetermined pattern of a gate pad 29 in the TFT substrate according to an exemplary embodiment of the present invention. A contact layer 83 and a pixel electrode 81 contact the semiconductor pattern 42 through contact holes 55 and 56 formed in the etch-stop pattern 53.

A first auxiliary gate pad 82, which is made of the same material as the pixel electrode 81, and a second auxiliary gate pad 67, which is made of the same material as data wring, are formed on the gate pad 29.

Hereinafter, a method of fabricating the TFT substrate according to an exemplary embodiment of the present invention will be described with reference to FIGS. 23 through 30. FIGS. 25 through 30 are cross-sectional views sequentially illustrating processes included in a method of fabricating the TFT substrate according to an exemplary embodiment of the present invention.

Figure 25:
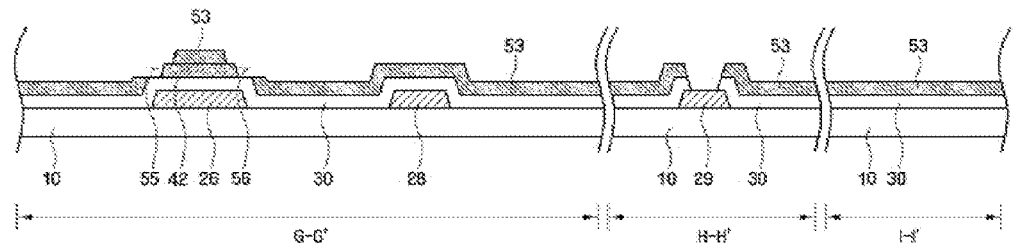
FIGS. 25 through 30 are cross-sectional views sequentially illustrating processes included in a method of fabricating the TFT substrate according to an exemplary embodiment of the present invention.

Referring to FIGS. 23 and 25, a gate wiring conductive film which contains copper is formed on the substrate 10 and then etched, thereby forming copper-containing gate wiring (including a gate line 22 and a gate electrode 26), storage wiring 29, and the gate pad 29.

Next, a gate insulating film 30 is formed on the gate wiring, the storage wiring 28, and the gate pad 29. Then, a semiconductor layer is formed on the gate insulating film 30 and etched to form the semiconductor pattern 42.

Thereafter, an etch-stop film is formed on the semiconductor pattern 42 and the gate insulating film 30. The etch-stop film formed on a predetermined region of the semiconductor pattern 42 is removed, thereby forming the contact holes 55 and 56 through which the semiconductor pattern 42 can contact the contact layer 83 and the pixel electrode 81 which will be subsequently formed. Here, a predetermined region of the gate insulating film 30 and the etch-stop film formed on the gate pad 29 are removed. The contact holes 55 and 56 may be formed in a top surface of the semiconductor pattern 42. When the semiconductor pattern 42 is an oxide semiconductor pattern, if the contact holes 55 and 56 are formed in the top surface of the semiconductor pattern 42, the oxide semiconductor can protect the gate electrode 26 during dry etching performed to form the contact holes 55 and 56.

Figure 26:
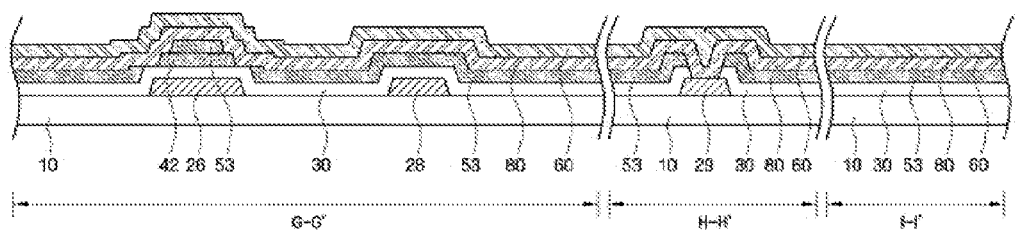

Next, referring to FIG. 26, a transparent conductive film 80 and a copper-containing data wiring conductive film 60 are sequentially formed on the semiconductor pattern 42 and the etch-stop pattern 53.

Figure 27:
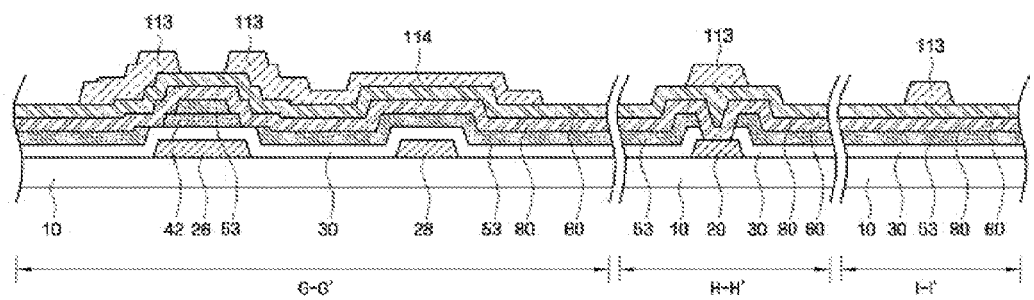

Then, referring to FIGS. 23, 24, and 27, a photoresist layer is coated on the data wiring conductive film 60 and patterned to form a photoresist pattern 113 and 114 which is used to form the pixel electrode 81, the contact layer 83, the first and second auxiliary gate pads 82 and 67, an auxiliary data pad 89, data wiring (including a data line 62, a source electrode 65 and a drain electrode 66), and a data pad 69. The photoresist pattern 113 and 114 includes two regions of different thicknesses. A thin region 114 covers a region in which the pixel electrode 81 is to be formed, and a thick region 113 covers a region in which the contact layer 83, the first and second auxiliary gate pads 82 and 67, the auxiliary data pad 89, the data wiring, and the data pad 69 may be formed.

Figure 28:
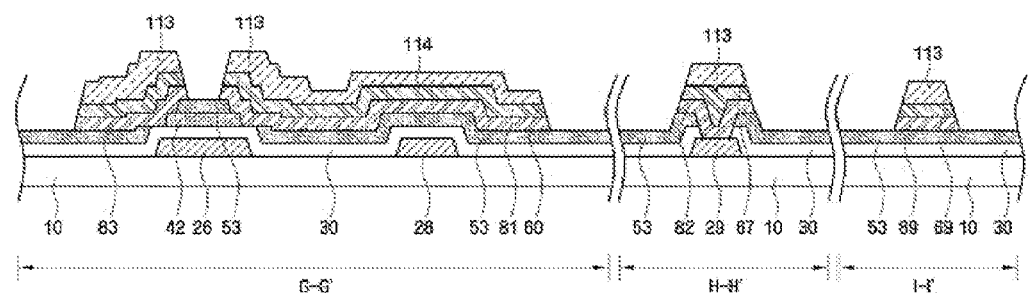

Next, referring to FIGS. 27 and 28, the data wiring conductive film 60 and the transparent conductive film 80 are etched using the photoresist pattern as an etch mask. As a result of etching the transparent conductive film 80, the pixel electrode 81, the contact layer 83, the first auxiliary gate pad 82, and the auxiliary data pad 89 are formed. The data wiring conductive film 60 in a gate pad region and a data pad region is etched, thereby forming the second auxiliary gate pad 67 and the data pad 69.

As described above, the transparent conductive film 80 is formed before the data conductive film 60, and the transparent conductive film 80 and the data wiring conductive film 60 are etched using one second photoresist pattern. Accordingly, the number of masks used can be reduced. In addition, since the contact layer 83 and the pixel electrode 81 which contact the semiconductor pattern 42 are formed by patterning the transparent conductive film 80 under the data wiring conductive film 60, contact characteristics between the semiconductor pattern 42 and the source and drain electrodes 65 and 66 can be improved, especially when the semiconductor pattern 42 is an oxide semiconductor pattern.

Figure 29:
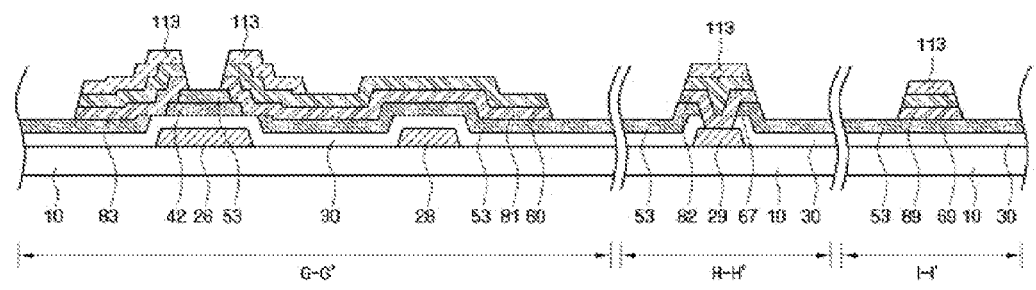

Next, referring to FIGS. 28 and 29, the second photoresist pattern 113 and 114 is etched back, thereby leaving the thick region 113 while removing the thin region 114.

Figure 30:
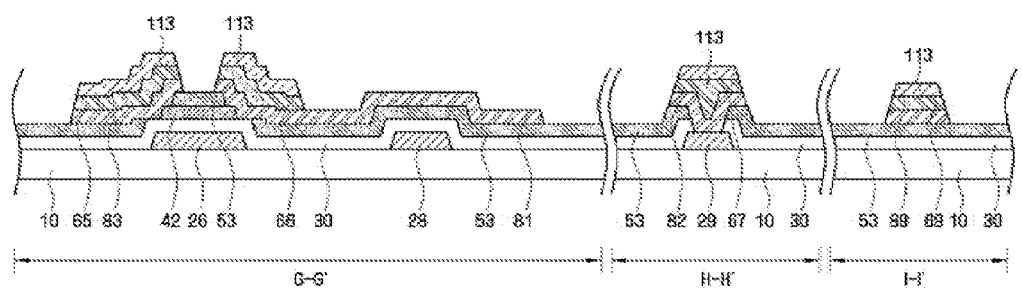

Then, referring to FIGS. 29 and 30, the data wiring conductive film 60 is etched using the remaining thick region 113 of the second photoresist pattern as an etch mask. As a result of etching the data wiring conductive film 60, the data wiring is formed.

Next, referring to FIG. 24, the remaining thick region 113 of the second photoresist pattern is removed.

Figure 31:
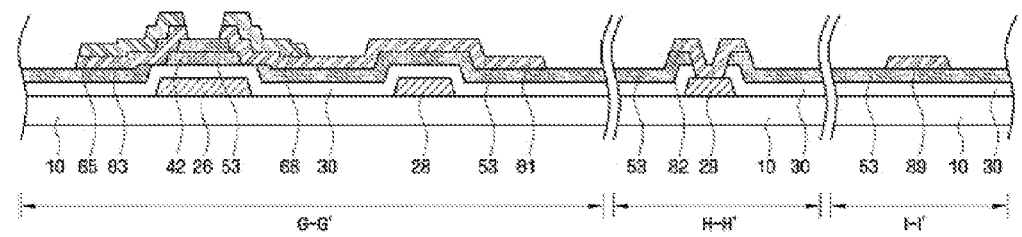
FIG. 31 is a cross-sectional view of a modified example of the TFT substrate illustrated in FIG. 23.

A modified example of the TFT substrate illustrated in FIGS. 25 through 30 according to an exemplary embodiment of the present invention will now be described with reference to FIG. 31. FIG. 31 is a cross-sectional view of a modified example of the TFT substrate illustrated in FIGS. 25 through 30 according to an exemplary embodiment of the present invention.

Referring to FIG. 31, a second auxiliary gate pad 67 and a data pad 69 are removed from a gate pad region and a data pad region, thereby exposing a first auxiliary gate pad 82 and an auxiliary data pad 89 which are formed of a transparent conductive film.

Figure 32:
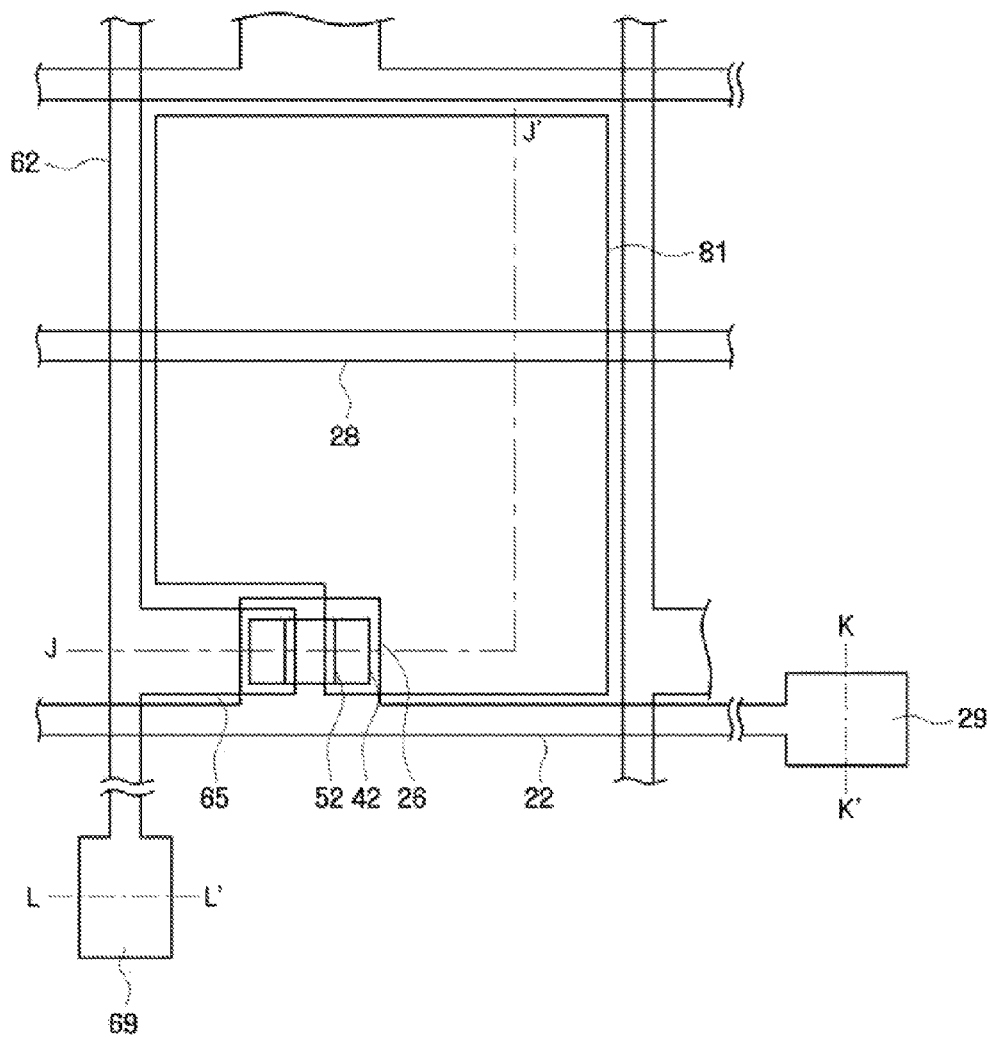
FIG. 32 is a layout view of a TFT substrate according to an exemplary embodiment of the present invention.
Figure 33:
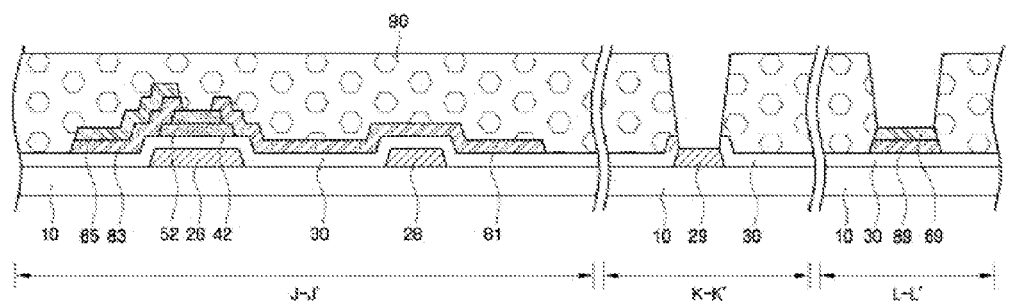
FIG. 33 is a cross-sectional view of the TFT substrate of FIG. 32 taken along the lines J-J', K-K', and L-L'.

Hereinafter, a TFT substrate according to an exemplary embodiment of the present invention will be described in detail with reference to FIGS. 32 and 33. FIG. 32 is a layout view of a TFT substrate according to an exemplary embodiment of the present invention. FIG. 33 is a cross-sectional view of the TFT substrate of FIG. 32 taken along the lines J-J', K-K', and L-L'. Elements substantially identical to those described above may be indicated by like reference numerals, and thus their description may be omitted.

Referring to FIGS. 32 and 33, the TFT substrate according to an exemplary embodiment does not include a drain electrode (indicated by reference numeral 66 in FIG. 1). The presence of a drain electrode may be used to reduce resistance. However, since a drain electrode is typically smaller than a pixel electrode 81, it can be removed as shown in FIGS. 32 and 33 where the absence of the drain electrode does not have a significant adverse effect on resistance.

Hereinafter, a method of fabricating the TFT substrate according to an exemplary embodiment of the present invention will be described with reference to FIGS. 4 through 9 and 32 through 37. FIGS. 34 through 37 are cross-sectional views sequentially illustrating some processes included in a method of fabricating the TFT substrate according to an exemplary embodiment of the present invention. Elements substantially identical to those described above may be indicated by like reference numerals, and thus their description may be omitted. First, gate wiring (including a gate line 22 and a gate electrode 26), a storage wiring 28, a gate pad 29, a gate insulating film 30, a semiconductor pattern 42, an etch-stop pattern 52, a transparent conductive film 80, and a copper-containing data wiring conductive film 60 are formed on a substrate 10 using the processes illustrated in FIGS. 4 through 9.

Figure 34:
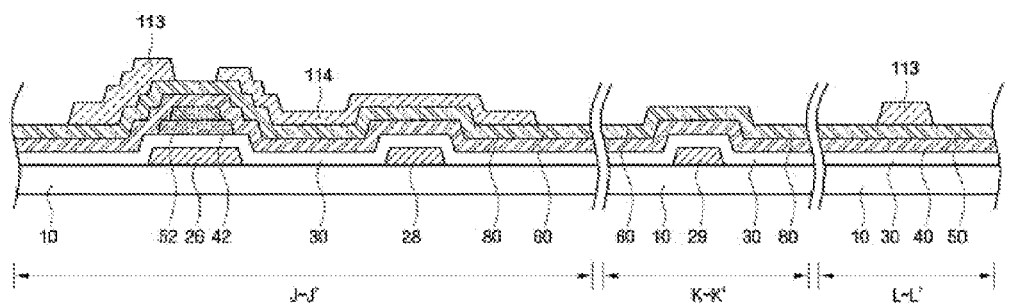
FIGS. 34 through 37 are cross-sectional views sequentially illustrating some processes included in a method of fabricating the TFT substrate according to an exemplary embodiment of the present invention.

Then, referring to FIGS. 32 through 34, a photoresist layer is coated on the data wiring conductive film 60 and patterned to form a second photoresist pattern which is used to form a pixel electrode 81, a contact layer 83, an auxiliary data pad 89, data wiring (including a data line 62 and a source electrode 65), and a data pad 69. The second photoresist pattern includes two regions of difference thicknesses. A thin region 114 covers a region in which the pixel electrode 81 is to be formed, and a thick region 113 covers a region in which the contact layer 83, the auxiliary data pad 89, the data wiring, and the data pad 69 may be formed.

Figure 35:
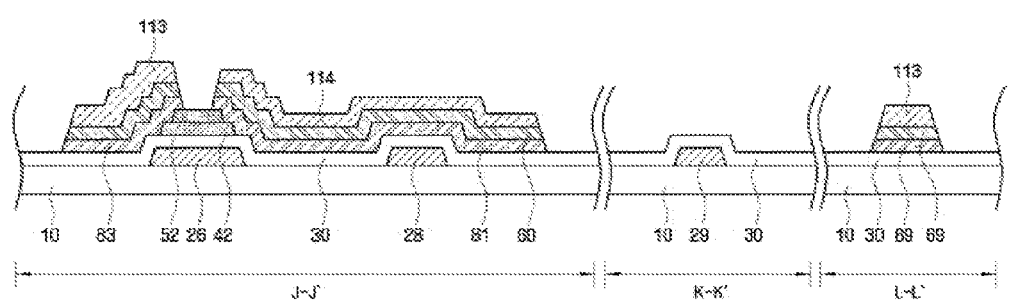

Next, referring to FIGS. 34 and 35, the data wiring conductive film 60 and the transparent conductive film 80 are etched using the second photoresist pattern 113 and 114 as an etch mask.

Figure 36:
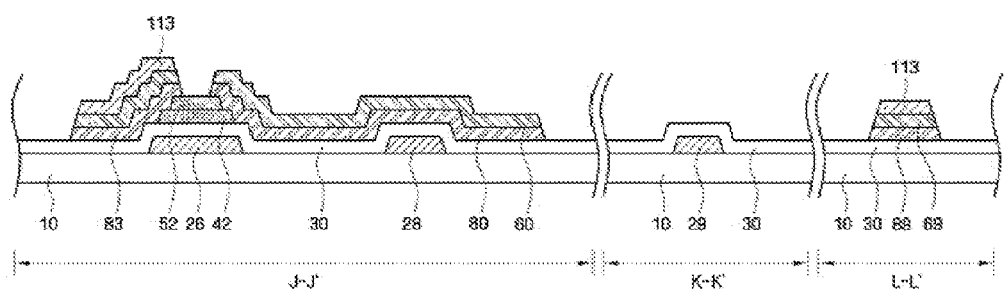

Then, referring to FIGS. 35 and 36, the second photoresist pattern 113 and 114 is etched back, thereby leaving the thick region 113 while removing the thin region 114.

Figure 37:
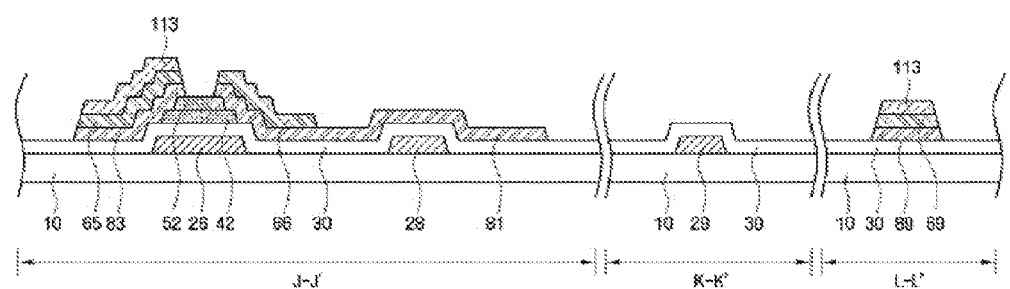

Next, referring to FIGS. 36 and 37, the data wiring conductive film 60 is etched using the remaining thick region 113 of the second photoresist pattern as an etch mask. Consequently, no drain electrode is formed on the pixel electrode 81, and the TFT substrate according to an exemplary embodiment includes only the source electrode 65.

Next, referring to FIGS. 37 and 33, the remaining thick region 113 of the second photoresist pattern is removed. Then, a protective film 90 is formed on the source electrode 65 and the pixel electrode 81.

While the present invention has been particularly shown and described with reference to exemplary embodiments thereof, it will be understood by those of ordinary skill in the art that various changes in form and detail may be made therein without departing from the spirit and scope of the present invention. The exemplary embodiments should be considered in a descriptive sense only and not for purposes of limitation.

What is claimed is:

1. A thin-film transistor substrate comprising:
    a gate wiring disposed on a substrate, the gate wiring comprising a gate electrode;
    a semiconductor pattern disposed on the gate wiring;
    an etch-stop pattern disposed on the semiconductor pattern over the gate electrode;
    a data wiring comprising a source electrode which is disposed on the semiconductor pattern and the etch-stop pattern; and
    a pixel electrode disposed on the semiconductor pattern, wherein the pixel electrode directly contacts the semiconductor pattern.

2. The thin-film transistor substrate of claim 1, further comprising a contact layer formed between the semiconductor pattern and the data wiring, wherein the semiconductor pattern contacts the pixel electrode and the contact layer.

3. The thin-film transistor substrate of claim 2, wherein the pixel electrode and the contact layer comprise a transparent conductive film.

4. The thin-film transistor substrate of claim 3, wherein the semiconductor pattern is an oxide semiconductor pattern.

5. The thin-film transistor substrate of claim 1, wherein at least one of the gate wiring and the data wiring comprises a metal layer and a buffer layer disposed on or under the metal layer.

6. The thin-film transistor substrate of claim 5, wherein the metal layer comprises copper.

7. The thin-film transistor substrate of claim 5, wherein the buffer layer comprises one or more of Mo, Ti, W, an alloy of the above metals, an oxide of the above metals, a nitride of the above metals, SiOx, SiNx, or SiON.

8. A thin-film transistor substrate comprising:
a gate wiring disposed on a substrate, the gate wiring comprising a gate electrode;
a semiconductor pattern formed on the gate wiring;
a pixel electrode disposed on the semiconductor pattern; and
a data wiring comprising a source electrode which is disposed on the pixel electrode,
wherein the pixel electrode directly contacts the semiconductor pattern.

9. The thin-film transistor substrate of claim 8, further comprising a contact layer disposed between the semiconductor pattern and the data wiring, wherein the semiconductor pattern contacts the pixel electrode and the contact layer.

10. The thin-film transistor substrate of claim 9, wherein the pixel electrode and the contact layer comprise a transparent conductive film.

11. The thin-film transistor substrate of claim 10, wherein the semiconductor pattern is an oxide semiconductor pattern.

12. The thin-film transistor substrate of claim 8, further comprising a protective film disposed on the data wiring and the pixel electrode.

13. The thin-film transistor substrate of claim 12, wherein the protective film is a photosensitive organic film or a photosensitive inorganic film.

14. The thin-film transistor substrate of claim 8, wherein the data wiring further comprises a drain electrode disposed on the pixel electrode.

15. The thin-film transistor substrate of claim 8, wherein at least one of the gate wiring and the data wiring comprises a metal layer.

16. The thin-film transistor substrate of claim 15, wherein the metal layer comprises copper.

17. The thin-film transistor substrate of claim 8, further comprising a storage wiring disposed on the substrate.

18. The thin-film transistor substrate of claim 17, wherein the storage wiring is disposed on the same layer as the gate wiring, and wherein the storage wiring and the pixel electrode overlap each other and form a storage capacitor.

19. The thin-film transistor substrate of claim 8, further comprising an auxiliary data pad disposed on the same layer as the pixel electrode.

20. The thin-film transistor substrate of claim 19, wherein the data wiring further comprises a data pad disposed on the auxiliary data pad.

21. A method of fabricating a thin-film transistor substrate, the method comprising:
forming gate wiring on a substrate;
sequentially forming a semiconductor layer and an etch-stop film on the gate wiring; forming a first photoresist pattern, which comprises two regions of different thicknesses, on the etch-stop film;
forming a semiconductor pattern and an etch-stop pattern by etching the semiconductor layer and the etch-stop film, respectively, using the first photoresist pattern;
sequentially forming a transparent conductive film and a data wiring conductive film on the semiconductor pattern and the etch-stop pattern;
forming a second photoresist pattern, which comprises two regions of different thicknesses, on the data wiring conductive film;
forming a pixel electrode and a contact layer by etching the transparent conductive film using the second photoresist pattern and forming data wiring by etching the data wiring conductive film using the second photoresist pattern, wherein the pixel electrode and the contact layer each comprise the transparent conductive film, and the data wiring comprises a source electrode comprising the data wiring conductive film;
forming a protective film on the data wiring and the pixel electrode, wherein the protective film exposes a top surface of a gate pad formed at an end of the gate wiring and a top surface of a data pad formed at an end of the data wiring; and
selectively forming a capping layer on the top surfaces of the gate pad and the data pad using the protective film.

22. The method of claim 21, wherein the first and second photoresist patterns are formed using a slit mask or a halftone mask.

23. The method of claim 21, wherein at least one of the gate wiring and the data wiring comprises a metal layer and a buffer layer disposed on or under the metal layer.

24. The method of claim 23, wherein the metal layer comprises copper.

25. The method of claim 21, wherein at least one of the gate wiring, the transparent conductive film and the data wiring conductive film comprises copper.

26. A method of fabricating a thin-film transistor substrate, the method comprising:
forming a gate wiring on a substrate;
forming a semiconductor pattern on the gate wiring;
forming a pixel electrode on the semiconductor pattern; and
forming a data wiring on the pixel electrode,
wherein the data wiring comprises a source electrode, and
wherein the pixel electrode is formed to directly contact the semiconductor pattern.

27. The method of claim 26, wherein at least one of the gate wiring and the data wiring comprises copper.

* * * * *